US010305464B2

(12) United States Patent
Nakamura

(10) Patent No.: US 10,305,464 B2
(45) Date of Patent: May 28, 2019

(54) CONTROL INTEGRATED CIRCUIT OF SWITCHING POWER-SUPPLY DEVICE AND SWITCHING POWER-SUPPLY DEVICE

(71) Applicant: Sanken Electric Co., LTD., Niiza-shi, Saitama (JP)

(72) Inventor: Hiroaki Nakamura, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 297 days.

(21) Appl. No.: 15/470,067

(22) Filed: Mar. 27, 2017

(65) Prior Publication Data

US 2018/0278245 A1 Sep. 27, 2018

(51) Int. Cl.

*H02M 1/00* (2006.01)
*H02M 1/32* (2007.01)
*H02M 3/158* (2006.01)
*H03K 17/082* (2006.01)

(52) U.S. Cl.

CPC .......... *H03K 17/0822* (2013.01); *H02M 1/32* (2013.01); *H02M 3/158* (2013.01); *H02M 2001/0006* (2013.01)

(58) Field of Classification Search

CPC .................. H02M 1/32; H02M 3/158; H02M 2001/0006; H03K 17/0822

USPC ............................................................ 361/88

See application file for complete search history.

(56) References Cited

U.S. PATENT DOCUMENTS

| | | | | |
|---|---|---|---|---|
| 2007/0171590 A1* | 7/2007 | Nagata | H02H 3/087 361/93.1 |
| 2012/0049829 A1* | 3/2012 | Murakami | H02M 1/32 323/288 |
| 2013/0076322 A1* | 3/2013 | Tateno | H02M 1/38 323/271 |
| 2017/0288538 A1* | 10/2017 | Yamada | H02M 3/156 |

FOREIGN PATENT DOCUMENTS

JP 2006-311646 A 11/2006

* cited by examiner

*Primary Examiner* — Kevin J Comber
(74) *Attorney, Agent, or Firm* — Banner & Witcoff, Ltd.

(57) ABSTRACT

A control IC of a switching power-supply device includes a switching element, a control circuit, a regenerative current element for allowing a regenerative current of an inductor to flow when the switching element is in a turned-off state, a ground terminal connected to the regenerative current element, and a protection circuit that forms, when a voltage of the connection point is equal to or less than a threshold value, a regenerative path which connects a connection point between the regenerative current element and the ground terminal to a specific terminal and through which the regenerative current flows, and stops on-and-off control of the switching element by the control circuit.

7 Claims, 5 Drawing Sheets

CONTROL INTEGRATED CIRCUIT OF SWITCHING POWER-SUPPLY DEVICE AND SWITCHING POWER-SUPPLY DEVICE

TECHNICAL FIELD

This disclosure relates to a control IC of a switching power-supply device and the switching power-supply device.

BACKGROUND ART

As a method for generating a stable voltage lower than an input voltage, a non-insulation type voltage dropping chopper circuit is widely used.

Japanese Unexamined Patent Application Publication (JP-A) No. 2006-311646 discloses a voltage dropping chopper circuit that generates a second DC voltage from a first DC voltage by controlling a switching element connected to an inductor.

In the present specification, a switching element denotes an element capable of performing conduction control between input and output by controlling a voltage applied to a control terminal (a base terminal or a gate terminal) of a bipolar transistor, a MOSFET and the like.

A control IC (Integrated Circuit) controlling the switching element in the voltage dropping chopper circuit includes a first ground terminal and a second ground terminal that is pulled down by an external resistor.

In the voltage dropping chopper circuit, in a normal state, the first ground terminal is connected to a control circuit section of the control IC for controlling the on-and-off timings of the switching element. When the first ground terminal is open, the control IC connects the control circuit section to the second ground terminal, thereby preventing an overcurrent from flowing through the switching element.

SUMMARY

The voltage dropping chopper circuit disclosed in JP-A-2006-311646 has a configuration in which the switching element exists outside of the control IC. Therefore, in a time when the switching element is turned off, a regenerative current of the inductor does not flow through the control IC.

In a voltage dropping chopper circuit in which the switching element exists in the control IC, a large regenerative current flows therein. Therefore, a terminal for allowing the regenerative current to flow outside is required.

However, when the terminal is open, since it is not possible to allow the regenerative current to flow outside, an excessive negative potential is generated in the control IC, so that destruction of the control IC may occur.

Since the voltage dropping chopper circuit disclosed in JP-A-2006-311646 has a configuration in which the switching element is not embedded in the control IC, a case in which the switching element is embedded in the control IC is not considered.

This disclosure provides a control IC of a switching power-supply device capable of ensuring stability of a product even when a terminal for allowing a regenerative current to flow outside is open, and the switching power-supply device having the control IC.

The control IC of the switching power-supply device of this disclosure is a control IC of a switching power-supply device that converts a first DC voltage supplied from a DC power source into a second DC voltage and outputs, and includes a switching element, which is connected between the DC power source and an inductor; a control circuit, which performs on-and-off control of the switching element; a regenerative current element, which is serially connected to the switching element and allows a regenerative current of the inductor to flow when the switching element is in a turned-off state; a ground terminal, which is connected to the regenerative current element; and a protection circuit that forms, when a voltage of the connection point is equal to or less than a threshold value, a regenerative path, which connects a connection point between the regenerative current element and the ground terminal to a specific terminal and through which the regenerative current flows and stops the on-and-off control of the switching element by the control circuit.

The switching power-supply device of this disclosure includes the aforementioned control IC and the aforementioned inductor.

According to this disclosure, it is possible to provide a control IC of a switching power-supply device capable of ensuring stability of a product even when a terminal for allowing a regenerative current to flow outside is open, and the switching power-supply device having the control IC.

DETAILED DESCRIPTION

Hereinafter, an embodiment of this disclosure will be described with reference to the drawings.

Figure 1:
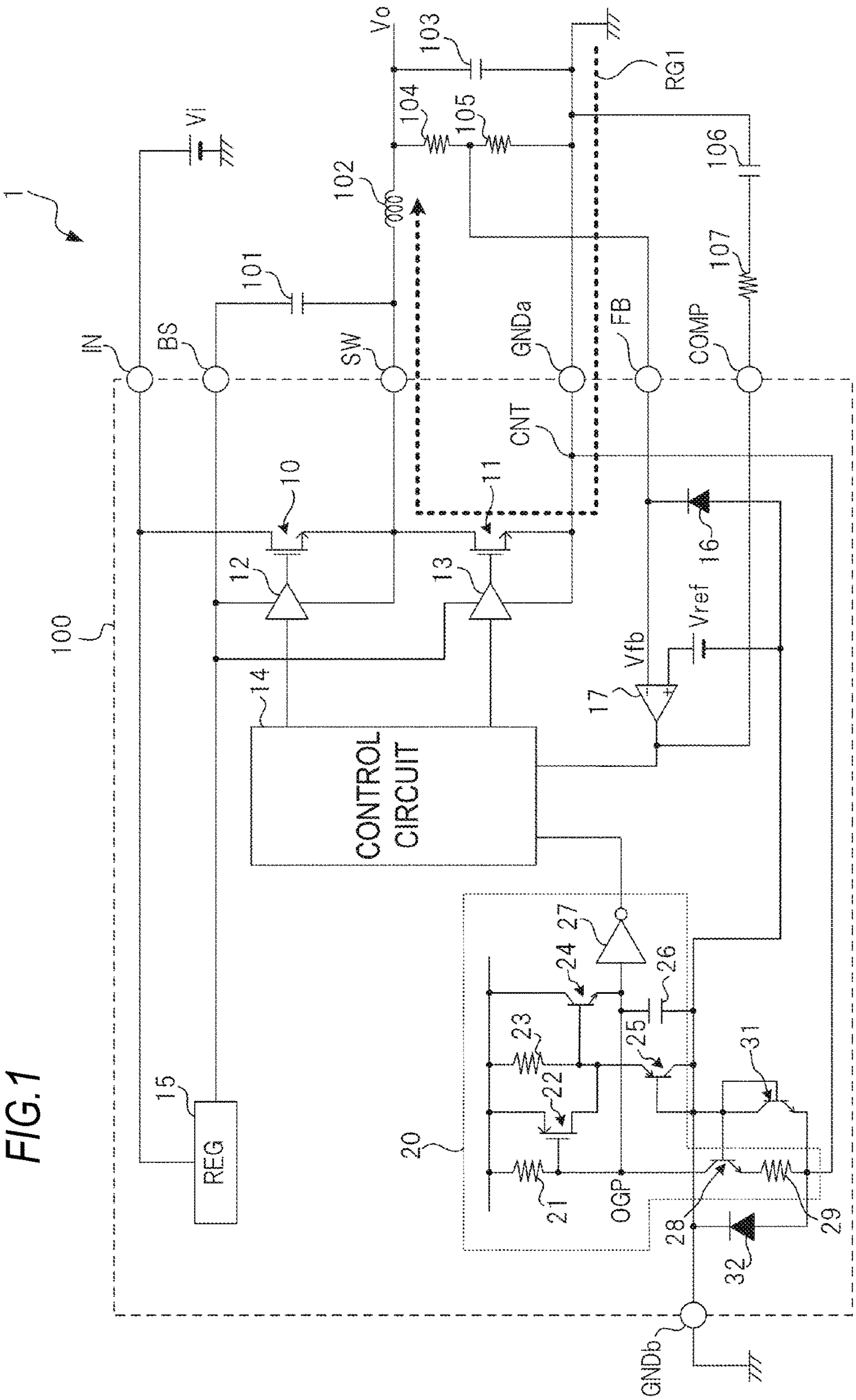
FIG. 1 is a circuit diagram illustrating a schematic configuration of a switching power-supply device 1 which is an embodiment of this disclosure.

FIG. 1 is a circuit diagram illustrating a schematic configuration of a switching power-supply device 1 which is an embodiment of this disclosure.

The switching power-supply device 1 includes a control IC 100, a bootstrap capacitor 101, an inductor 102, an output capacitor 103, a feedback resistor 104, a feedback resistor 105, a phase compensation capacitor 106, and a phase compensation resistor 107.

The control IC 100 includes, as terminals, an input terminal IN, a bootstrap terminal BS, a switching terminal SW, a first ground terminal GNDa connected to the ground, a feedback terminal FB, a phase compensation terminal COMP, and a second ground terminal GNDb connected to the ground. The second ground terminal GNDb serves as a specific terminal.

To the input terminal IN, a DC power source for supplying a first DC voltage Vi is connected.

One end of the inductor 102 is connected to the switching terminal SW of the control IC 100. The other end of the inductor 102 is connected to a load circuit (not illustrated).

The bootstrap capacitor 101 is connected between the bootstrap terminal BS and a connection point between the switching terminal SW and the inductor 102.

One end of the output capacitor 103 is connected to a connection point between the inductor 102 and the load circuit. The other end of the output capacitor 103 is connected to the ground.

One end of the feedback resistor 104 is connected to the connection point between the inductor 102 and the load circuit. The other end of the feedback resistor 104 is connected to one end of the feedback resistor 105. The other end of the feedback resistor 105 is connected to the ground.

To a connection point between the feedback resistor 104 and the feedback resistor 105, the feedback terminal FB is connected. A feedback voltage Vfb obtained by dividing an output voltage Vo supplied to the load circuit by the feedback resistor 104 and the feedback resistor 105 is input to the feedback terminal FB.

One end of the phase compensation capacitor 106 is connected to the ground. The other end of the phase compensation capacitor 106 is connected to one end of the phase compensation resistor 107. The other end of the phase compensation resistor 107 is connected to the phase compensation terminal COMP.

The control IC 100 includes a high-side MOSFET 10 which is one of switching elements, a low-side MOSFET 11 serving as a regenerative current element, a high-side drive circuit 12 for driving the high-side MOSFET 10, a low-side drive circuit 13 for driving the low-side MOSFET 11, a control circuit 14, a regulator 15, a diode 16, an error amplifier 17, a switching stop signal generation circuit 20, an NPN type bipolar transistor 31, and a diode 32.

The regulator 15 generates an internal voltage, which is required in the control IC 100, based on the first DC voltage Vi supplied from the input terminal IN, and outputs the internal voltage. The regulator 15 charges the bootstrap capacitor 101 and supplies the internal voltage to the low-side drive circuit 13.

The control circuit 14 generates a control signal for controlling ON/OFF of the high-side MOSFET 10 and the low-side MOSFET 11. The control circuit 14 supplies the control signal to the high-side drive circuit 12 and the low-side drive circuit 13. The control signal alternately repeats a high level and a low level.

The switching power-supply device 1 illustrated in FIG. 1 alternately turns on the high-side MOSFET 10 and the low-side MOSFET 11 according to the control signal generated by the control circuit 14 such that the high-side MOSFET 10 and the low-side MOSFET 11 are not turned on at the same time, thereby converting the first DC voltage Vi supplied from the DC power source into a second DC voltage (an output voltage Vo) and supplying the second DC voltage to the load circuit.

The high-side MOSFET 10 is connected between the input terminal IN and the switching terminal SW.

A drain terminal of the high-side MOSFET 10 is connected to the input terminal IN. A source terminal of the high-side MOSFET 10 is connected to the switching terminal SW. A gate terminal of the high-side MOSFET 10 is connected to an output terminal of the high-side driver 12.

The low-side MOSFET 11 is serially connected to the high-side MOSFET 10.

A drain terminal of the low-side MOSFET 11 is connected to the source terminal of the high-side MOSFET 10. A source terminal of the low-side MOSFET 11 is connected to the first ground terminal GNDa. A gate terminal of the low-side MOSFET 11 is connected to an output terminal of the low-side driver 13.

The high-side drive circuit 12 turns on the high-side MOSFET 10 when the control signal input from the control circuit 14 has a high level and turns off the high-side MOSFET 10 when the control signal has a low level. When the control signal is in the high level state, the high-side drive circuit 12 operates by a voltage supplied from the bootstrap capacitor 101.

The low-side drive circuit 13 turns on the low-side MOSFET 11 when the control signal input from the control circuit 14 has a high level and turns off the low-side MOSFET 11 when the control signal has a low level. The low-side drive circuit 13 operates by a voltage generated in the regulator 15.

The error amplifier 17 amplifies an error between the feedback voltage Vfb, which is a voltage corresponding to the output voltage Vo input to the feedback terminal FB, and a reference voltage Vref, and outputs an error amplification signal.

A minus-side input terminal of the error amplifier 17 is connected to the feedback terminal FB. A plus-side input terminal of the error amplifier 17 is connected to a power source that supplies the reference voltage Vref. A negative electrode terminal of the power source that supplies the reference voltage Vref is connected to the second ground terminal GNDb.

An output terminal of the error amplifier 17 is connected to the phase compensation terminal COMP, so that phase compensation is performed. Based on the error amplification signal output from the error amplifier 17, the control circuit 14 controls the control signal such that the output voltage Vo reaches a target value.

A cathode of the diode 16 is connected to the feedback terminal FB. An anode of the diode 16 is connected to the second ground terminal GNDb.

When a voltage of the connection point CNT is equal to or less than a threshold value smaller than a ground level, the bipolar transistor 31 serves as a regenerative path formation element that connects a connection point CNT between the source terminal of the low-side MOSFET 11 and the first ground terminal GNDa to the second ground terminal GNDb and forms a regenerative path through which a regenerative current of the inductor 102 flows from the connection point CNT to the second ground terminal GNDb.

An emitter terminal of the bipolar transistor 31 is connected to the connection point CNT. A collector terminal of the bipolar transistor 31 is connected to the second ground terminal GNDb. A base terminal of the bipolar transistor 31 is connected to the collector terminal of the bipolar transistor 31.

An anode of the diode 32 is connected to the connection point CNT. A cathode of the diode 32 is connected to the second ground terminal GNDb.

When the voltage of the connection point CNT is equal to or less than the aforementioned threshold value, the switching stop signal generation circuit 20 generates a switching stop signal for stopping switching control by the control circuit 14 and outputs the switching stop signal to the control circuit 14.

Specifically, the switching stop signal generation circuit 20 includes a resistor 21, a MOSFET 22, a resistor 23, an NPN type bipolar transistor 24, a PNP type bipolar transistor 25, a capacitor 26, a NOT circuit 27, an NPN type bipolar transistor 28, and a resistor 29.

One end of the resistor 29 is connected to the connection point CNT. The other end of the resistor 29 is connected to an emitter terminal of the bipolar transistor 28. A base terminal of the bipolar transistor 28 is connected to the collector terminal of the bipolar transistor 31. A collector terminal of the bipolar transistor 28 is connected to one end of the resistor 21. The other end of the resistor 21 is connected to the regulator 15.

To a connection point between the resistor 21 and the bipolar transistor 28, a gate terminal of the MOSFET 22 is connected. A source terminal of the MOSFET 22 is connected to the regulator 15.

One end of the resistor 23 is connected to an emitter terminal of the bipolar transistor 25. The other end of the resistor 23 is connected to the regulator 15. A base terminal and a collector terminal of the bipolar transistor 25 are connected to the second ground terminal GNDb. A drain terminal of the MOSFET 22 is connected to a connection point between the resistor 23 and the bipolar transistor 25.

To the connection point between the resistor 23 and the bipolar transistor 25, a base terminal of the bipolar transistor 24 is connected. A collector terminal of the bipolar transistor 24 is connected to the regulator 15. An emitter terminal of the bipolar transistor 24 is connected to an input terminal of the NOT circuit 27.

To the input terminal of the NOT circuit 27, the connection point between the resistor 21 and the bipolar transistor 28 is connected. The capacitor 26 is connected between the connection point and the second ground terminal GNDb.

An output signal of the NOT circuit 27 is inputted to the control circuit 14. The control circuit 14 performs the switching control when the output signal of the NOT circuit 27 is in a low level state and stops the switching control when the output signal of the NOT circuit 27 is in a high level state. A high level output signal output from the NOT circuit 27 constitutes the switching stop signal.

By the switching stop signal generation circuit 20 and the bipolar transistor 31, a protection circuit is configured.

An operation of the switching power-supply device 1 configured as above will be described.

In a normal state in which the first ground terminal GNDa is not open, the potential of the connection point CNT is a ground potential. Therefore, a voltage difference between the base and the emitter of the bipolar transistor 31 is 0 V, so that the bipolar transistor 31 is turned off and the bipolar transistor 28 is also turned off.

Consequently, in a period in which the high-side MOSFET 10 is turned off and the low-side MOSFET 11 is turned on, the regenerative current of the inductor 102 is discharged outside of the control IC 100 through a first path (a path interconnecting the inductor 102, the switching terminal SW, the low-side MOSFET 11, the first ground terminal GNDa, and the ground) indicated by a broken line RG1 of FIG. 1.

In an abnormal state in which the first ground terminal GNDa is open, in the period in which the high-side MOSFET 10 is turned off and the low-side MOSFET 11 is turned on, the regenerative current of the inductor 102 cannot be discharged to the ground through the first path illustrated in FIG. 1.

Therefore, in this period, the potential of the connection point CNT is largely reduced in a minus direction from 0 V. In this way, the voltage difference between the base and the emitter of the bipolar transistor 31 becomes large, so that the bipolar transistor 31 is turned on.

Figure 2:
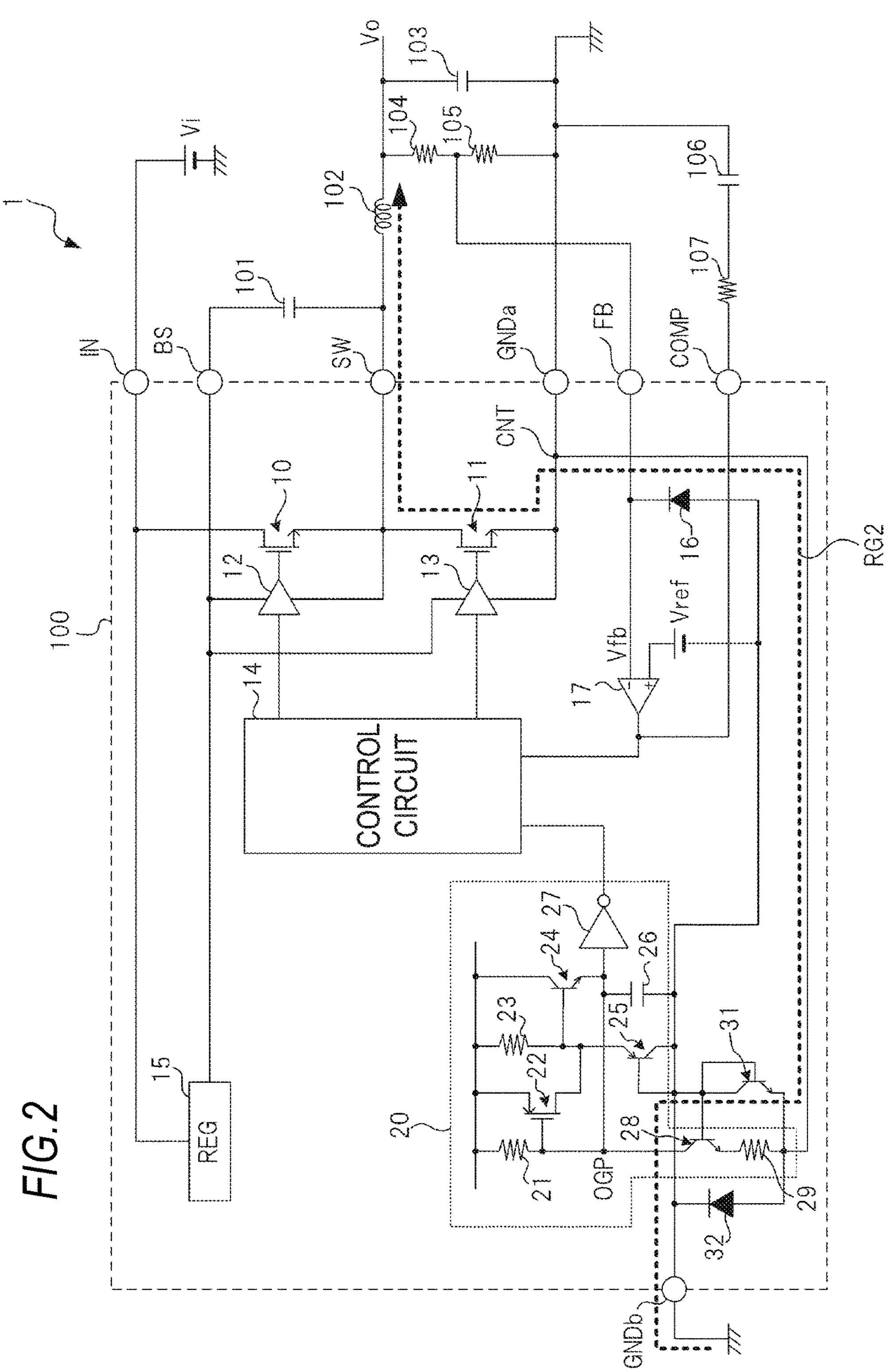
FIG. 2 is a diagram illustrating a regenerative path when the switching power-supply device 1 illustrated in FIG. 1 is in an abnormal state.

The bipolar transistor 31 is turned on, so that the regenerative current of the inductor 102 is discharged outside of the control IC 100 through a second path (a path interconnecting the inductor 102, the switching terminal SW, the low-side MOSFET 11, the connection point CNT, the bipolar transistor 31, the second ground terminal GNDb, and the ground) indicated by a broken line RG2 of FIG. 2.

Furthermore, the bipolar transistor 31 is turned on, so that the bipolar transistor 28 is turned on. In this way, a potential OGP of the connection point between the bipolar transistor 28 and the resistor 21 is reduced. Consequently, the input of the NOT circuit 27 is at a low level, so that a high level switching stop signal is output from the NOT circuit 27.

The control circuit 14 receives the switching stop signal to stop the switching control. In this way, the high-side MOSFET 10 and the low-side MOSFET 11 are turned off, so that stability is ensured.

As described above, according to the switching power-supply device 1, even when the first ground terminal GNDa is open, it is possible to form a regenerative path for allowing the regenerative current of the inductor 102 to flow outside of the control IC 100. Therefore, a large negative potential is prevented from being generated in the control IC 100, so that it is possible to prevent destruction and the like of the control IC 100.

Furthermore, according to the switching power-supply device 1, the regenerative current flows through the second path, so that the switching stop signal generation circuit 20 operates and thus the switching control is stopped. Therefore, it is possible to rapidly and reliably stop the switching operation in the abnormal state.

Figure 3:
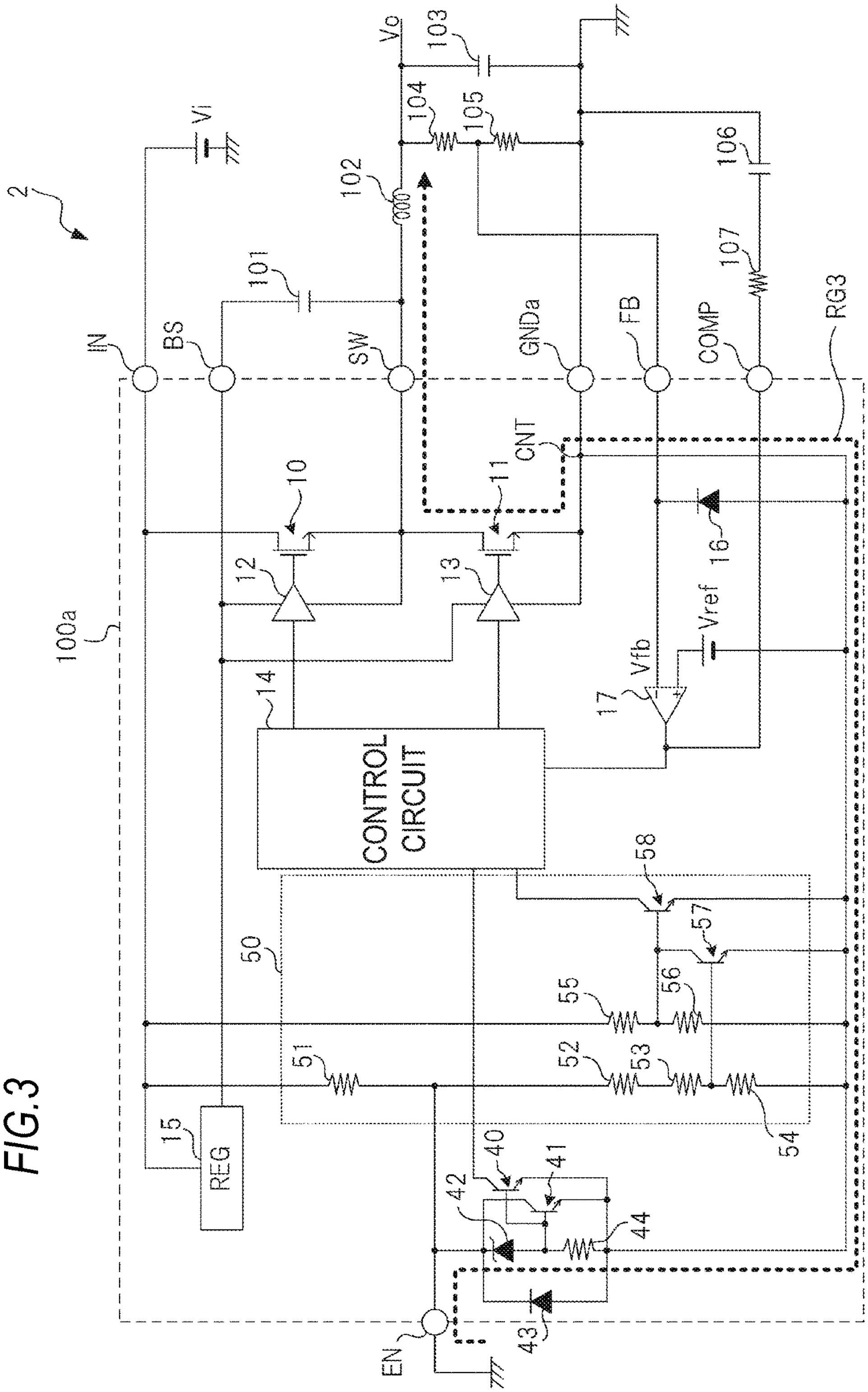
FIG. 3 is a circuit diagram illustrating a schematic configuration of a switching power-supply device 2 which is a modified example of the switching power-supply device 1 illustrated in FIG. 1.

FIG. 3 is a circuit diagram illustrating a schematic configuration of a switching power-supply device 2 which is a modified example of the switching power-supply device 1 illustrated in FIG. 1. In FIG. 3, the same elements as those of FIG. 1 are denoted by the same reference numerals, and a description thereof is omitted.

The switching power-supply device 2 has a configuration in which the control IC 100 in the switching power-supply device 1 illustrated in FIG. 1 is changed to a control IC 100*a*. In a terminal configuration of the control IC 100*a*, the second ground terminal GNDb in the control IC 100 is removed and an enable terminal EN is added instated. The enable terminal EN is connected to the ground outside of the control IC 100*a* in the state in which the first DC voltage Vi is input to the input terminal IN. The enable terminal EN serves as a specific terminal.

The control IC 100*a* of the switching power-supply device 2 is the same as the control IC 100 of the switching power-supply device 1 in terms of including the high-side MOSFET 10, the low-side MOSFET 11, the high-side drive circuit 12, the low-side drive circuit 13, the control circuit 14, the regulator 15, the diode 16, and the error amplifier 17. However, in the switching power-supply device 2, the negative electrode terminal of the power source for supplying the reference voltage Vref and the anode of the diode 16 are connected to the connection point CNT.

In addition to the aforementioned configuration, the control IC 100*a* of the switching power-supply device 2 includes an NPN type bipolar transistor 40, an NPN type bipolar transistor 41, a Zener diode 42, a diode 43, a resistor 44, and an enable circuit 50.

The enable circuit 50 includes a resistor 51, a resistor 52, a resistor 53, a resistor 54, a resistor 55, a resistor 56, an NPN type bipolar transistor 57, and an NPN type bipolar transistor 58.

The resistor 51, the resistor 52, the resistor 53, and the resistor 54 are serially connected to one another in this order, wherein the resistor 51 is connected to the input terminal IN and the resistor 54 is connected to the connection point CNT.

To a connection point between the resistor 51 and the resistor 52, the enable terminal EN is connected. To a connection point between the resistor 53 and the resistor 54, a base terminal of the bipolar transistor 57 is connected.

The resistor 55 and the resistor 56 are serially connected to each other, wherein the resistor 55 is connected to the input terminal IN and the resistor 56 is connected to the connection point CNT. A connection point between the resistor 55 and the resistor 56 is connected to a base terminal of the bipolar transistor 58.

A collector terminal of the bipolar transistor 57 is connected to the base terminal of the bipolar transistor 58. An emitter terminal of the bipolar transistor 57 and an emitter terminal of the bipolar transistor 58 are respectively connected to the connection point CNT. A collector terminal of the bipolar transistor 58 is connected to the control circuit 14.

In the enable circuit 50, when the enable terminal EN is connected to the ground (when enable input is in a low state), the bipolar transistor 57 is turned off and the bipolar transistor 58 is turned on. When the bipolar transistor 58 is in the turned-on state, an enable signal for validating switching control is input to the control circuit 14 from the bipolar transistor 58. When the enable signal is received, the control circuit 14 performs the switching control.

In the enable circuit 50, when the enable input is in a high state, the bipolar transistor 57 is turned on and the bipolar transistor 58 is turned off. When the bipolar transistor 58 is in the turned-off state, a disenable signal for invalidating the switching control is input to the control circuit 14 from the bipolar transistor 58. In a state where the disenable signal is being received, the control circuit 14 stops the switching control.

A cathode of the Zener diode 42 is connected to the enable terminal EN. An anode of the Zener diode 42 is connected to one end of the resistor 44. The other end of the resistor 44 is connected to the connection point CNT.

A base terminal of the bipolar transistor 41 is connected to a connection point between the Zener diode 42 and the resistor 44. A collector terminal of the bipolar transistor 41 is connected to a connection point between the Zener diode 42 and the enable terminal EN. An emitter terminal of the bipolar transistor 41 is connected to a connection point between the resistor 44 and the connection point CNT.

A base terminal of the bipolar transistor 40 is connected to the connection point between the Zener diode 42 and the resistor 44, and the base terminal of the bipolar transistor 41.

A collector terminal of the bipolar transistor 40 is connected to the control circuit 14. An emitter terminal of the bipolar transistor 40 is connected to the connection point between the resistor 44 and the connection point CNT.

When a voltage of the connection point CNT is equal to or less than a threshold value smaller than a ground level, the bipolar transistor 41, the Zener diode 42, and the resistor 44 serve as a regenerative path formation element that forms a regenerative path which connects the connection point CNT to the enable terminal EN and through which a regenerative current of the inductor 102 flows from the connection point CNT to the enable terminal EN.

When the voltage of the connection point CNT is equal to or less than the threshold value smaller than the ground level and the regenerative current flows through the bipolar transistor 41 and the Zener diode 42, the bipolar transistor 40 is turned on, thereby inputting a switching stop signal for stopping the switching control by the control circuit 14 to the control circuit 14.

A cathode of the diode 43 is connected to the connection point between the Zener diode 42 and the enable terminal EN. An anode of the diode 43 is connected to the connection point between the resistor 44 and the connection point CNT.

By the bipolar transistor 40, the bipolar transistor 41, the Zener diode 42, and the resistor 44, a protection circuit is configured.

An operation of the switching power-supply device 2 configured as above will be described.

In a normal state in which the first ground terminal GNDa is not open, the potential of the connection point CNT is a ground potential. Therefore, a voltage difference between the base and the emitter of the bipolar transistor 41 becomes 0 V, so that the bipolar transistor 41 is turned off and the bipolar transistor 40 is also turned off.

Consequently, in a period in which the high-side MOSFET 10 is turned off and the low-side MOSFET 11 is turned on, the regenerative current of the inductor 102 is discharged outside of the control IC **100*a* through a path (a path interconnecting the inductor 102, the switching terminal SW, the low-side MOSFET 11, the first ground terminal GNDa, and the ground) similar to the path indicated by the broken line RG of FIG. 1**.

In an abnormal state in which the first ground terminal GNDa is open, in the period in which the high-side MOSFET 10 is turned off and the low-side MOSFET 11 is turned on, the regenerative current of the inductor 102 cannot be discharged to the ground through the aforementioned path.

Therefore, in this period, the potential of the connection point CNT is largely reduced in a minus direction from 0 V. In this way, the voltage difference between the base and the emitter of the bipolar transistor 41 becomes large, so that the bipolar transistor 41 is turned on.

The bipolar transistor 41 is turned on, so that the bipolar transistor 41 and the Zener diode 42 reach a state in which a current flows and thus the regenerative current of the inductor 102 is discharged outside of the control IC **100*a* through a third path (a path interconnecting the inductor 102, the switching terminal SW, the low-side MOSFET 11, the connection point CNT, the bipolar transistor 41 (the resistor 44 and the Zener diode 42), the enable terminal EN, and the ground) indicated by a broken line RG3 of FIG. 3**.

Furthermore, the bipolar transistor 41 is turned on, so that the bipolar transistor 40 is turned on. In this way, the switching stop signal is input to the control circuit 14 from the bipolar transistor 40.

The control circuit 14 receives the switching stop signal to stop the switching control. In this way, the high-side MOSFET 10 and the low-side MOSFET 11 are turned off, so that stability is ensured.

As described above, according to the switching power-supply device 2, even when the first ground terminal GNDa is open, it is possible to allow the regenerative current of the inductor 102 to flow outside of the control IC **100*a* from the enable terminal EN. Therefore, a large negative potential is prevented from being generated in the control IC 100*a*, so that it is possible to prevent destruction and the like of the control IC 100*a***.

Furthermore, according to the switching power-supply device 2, it is possible to form a regenerative path by using the enable terminal EN generally provided in the control IC **100*a*. Therefore, it is possible to ensure stability when the first ground terminal GNDa is open without increasing the number of terminals of the control IC 100*a***.

Furthermore, according to the switching power-supply device 2, the regenerative current flows through the third path, so that the bipolar transistor 40 operates and thus the switching control is stopped. Therefore, it is possible to rapidly and reliably stop the switching operation in the abnormal state.

Figure 4:
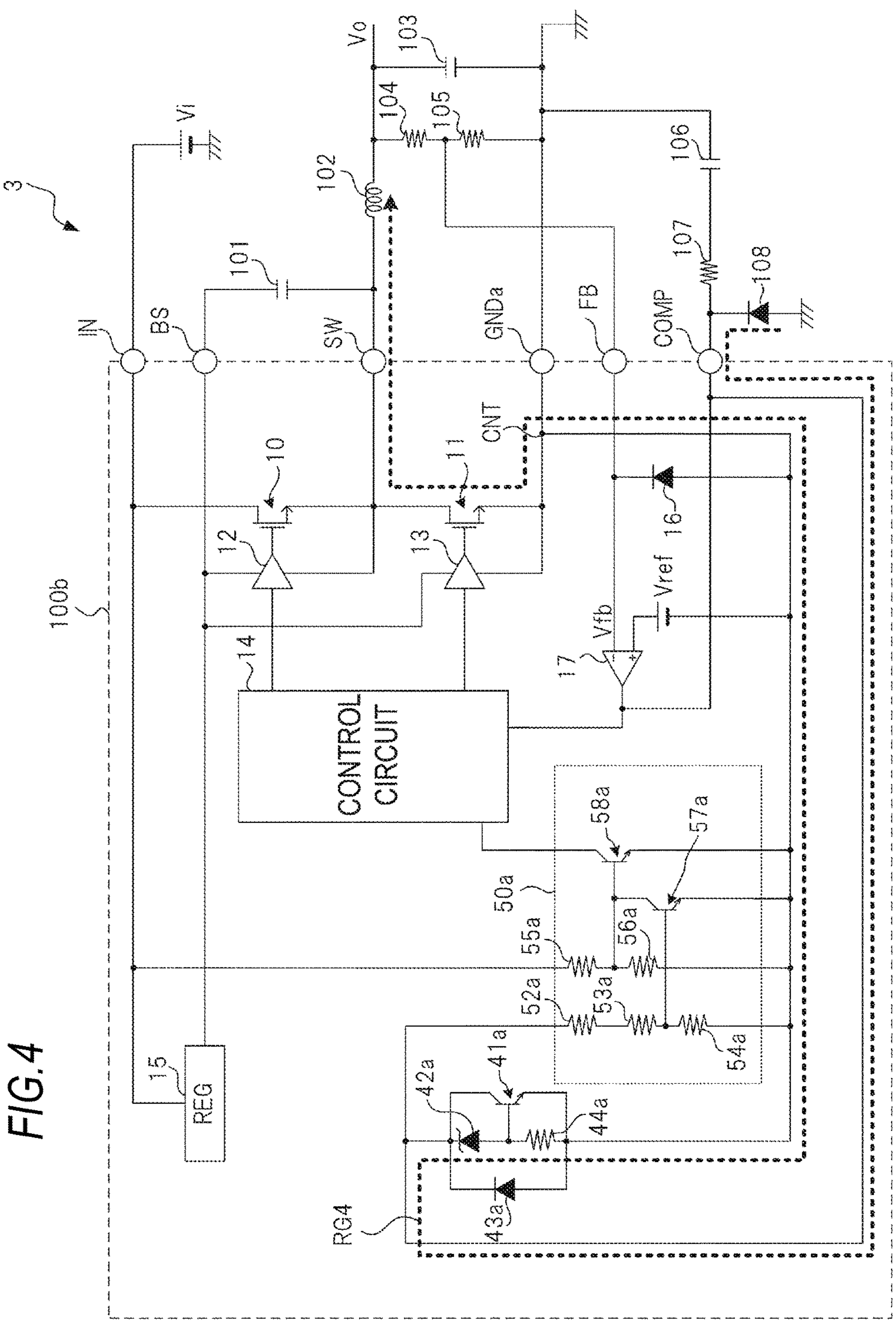
FIG. 4 is a circuit diagram illustrating a schematic configuration of a switching power-supply device 3 which is a modified example of the switching power-supply device 1 illustrated in FIG. 1.

FIG. 4 is a circuit diagram illustrating a schematic configuration of a switching power-supply device 3 which is a modified example of the switching power-supply device 1 illustrated in FIG. 1. In FIG. 4, the same elements as those of FIG. 1 are denoted by the same reference numerals, and a description thereof is omitted.

The switching power-supply device 3 has a configuration in which the control IC 100 in the switching power-supply device 1 illustrated in FIG. 1 is changed to a control IC 100*b* and a diode 108 is added. In a terminal configuration of the control IC 100*b*, the second ground terminal GNDb in the control IC 100 is removed. In the switching power-supply device 3, the phase compensation terminal COMP serves as a specific terminal.

A cathode of the diode 108 is connected to a connection point between the phase compensation terminal COMP and the phase compensation resistor 107. An anode of the diode 108 is connected to the ground.

The control IC 100*b* of the switching power-supply device 3 is the same as the control IC 100 of the switching power-supply device 1 in terms of including the high-side MOSFET 10, the low-side MOSFET 11, the high-side drive circuit 12, the low-side drive circuit 13, the control circuit 14, the regulator 15, the diode 16, and the error amplifier 17. However, in the switching power-supply device 3, the negative electrode terminal of the power source for supplying the reference voltage Vref and the anode of the diode 16 are connected to the connection point CNT.

In addition to the aforementioned configuration, the control IC 100*b* of the switching power-supply device 3 includes an NPN type bipolar transistor 41*a*, a Zener diode 42*a*, a diode 43*a*, a resistor 44*a*, and a switching stop signal generation circuit 50*a*.

The switching stop signal generation circuit 50*a* includes a resistor 52*a*, a resistor 53*a*, a resistor 54*a*, a resistor 55*a*, a resistor 56*a*, an NPN type bipolar transistor 57*a*, and an NPN type bipolar transistor 58*a*.

The resistor 52*a*, the resistor 53*a*, and the resistor 54*a* are serially connected to one another in this order, wherein the resistor 52*a* is connected to the phase compensation terminal COMP and the resistor 54*a* is connected to the connection point CNT. To a connection point between the resistor 53*a* and the resistor 54*a*, a base terminal of the bipolar transistor 57*a* is connected.

The resistor 55*a* and the resistor 56*a* are serially connected to each other, wherein the resistor 55*a* is connected to the input terminal IN and the resistor 56*a* is connected to the connection point CNT. A connection point between the resistor 55*a* and the resistor 56*a* is connected to a base terminal of the bipolar transistor 58*a*.

A collector terminal of the bipolar transistor 57*a* is connected to the base terminal of the bipolar transistor 58*a*.

An emitter terminal of the bipolar transistor 57*a* and an emitter terminal of the bipolar transistor 58*a* are respectively connected to the connection point CNT. A collector terminal of the bipolar transistor 58*a* is connected to the control circuit 14.

A cathode of the Zener diode 42*a* is connected to the phase compensation terminal COMP. To a connection point between the Zener diode 42*a* and the phase compensation terminal COMP, the aforementioned resistor 52*a* is connected.

An anode of the Zener diode 42*a* is connected to one end of the resistor 44*a*. The other end of the resistor 44*a* is connected to the connection point CNT. A connection point between the Zener diode 42*a* and the resistor 44*a* is connected to a base terminal of the bipolar transistor 41*a*.

A collector terminal of the bipolar transistor 41*a* is connected to a connection point between the Zener diode 42*a* and the phase compensation terminal COMP. An emitter terminal of the bipolar transistor 41*a* is connected to a connection point between the resistor 44*a* and the connection point CNT.

When a voltage of the connection point CNT is equal to or less than a threshold value smaller than a ground level, the bipolar transistor 41*a*, the Zener diode 42*a*, and the resistor 44*a* serve as a regenerative path formation element that connects the connection point CNT to the phase compensation terminal COMP and forms a regenerative path through which a regenerative current of the inductor 102 flows from the connection point CNT to the phase compensation terminal COMP.

A cathode of the diode 43*a* is connected to a connection point between the Zener diode 42*a* and the phase compensation terminal COMP. An anode of the diode 43 is connected to a connection point between the resistor 44*a* and the connection point CNT.

By the switching stop signal generation circuit 50*a*, the bipolar transistor 41*a*, the Zener diode 42*a*, and the resistor 44*a*, a protection circuit is configured.

An operation of the switching power-supply device 3 configured as above will be described.

In a normal state in which the first ground terminal GNDa is not open, the potential of the connection point CNT is a ground potential. Therefore, a voltage difference between the base and the emitter of the bipolar transistor 41*a* is small, so that the bipolar transistor 41*a* is turned off.

Consequently, in a period in which the high-side MOSFET 10 is turned off and the low-side MOSFET 11 is turned on, the regenerative current of the inductor 102 is discharged outside of the control IC 100*b* through a path (a path interconnecting the inductor 102, the switching terminal SW, the low-side MOSFET 11, the first ground terminal GNDa, and the ground) similar to the path indicated by the broken line RG of FIG. 1.

In an abnormal state in which the first ground terminal GNDa is open, in the period in which the high-side MOSFET 10 is turned off and the low-side MOSFET 11 is turned on, the regenerative current of the inductor 102 cannot be discharged outside of the control IC 100*b* through the aforementioned path.

Therefore, in this period, the potential of the connection point CNT is largely reduced in a minus direction from 0 V. In this way, the voltage difference between the base and the emitter of the bipolar transistor 41*a* becomes large, so that the bipolar transistor 41*a* is turned on.

The bipolar transistor 41*a* is turned on, so that the Zener diode 42*a* reaches a state in which a current flows and thus the regenerative current of the inductor 102*a* is discharged outside of the control IC 100*b* through a fourth path (a path interconnecting the inductor 102, the switching terminal SW, the low-side MOSFET 11, the connection point CNT, the bipolar transistor 41*a* (the resistor 44*a* and the Zener diode 42*a*), the phase compensation terminal COMP, the diode 108, and the ground) indicated by a broken line RG4 of FIG. 4.

Furthermore, when the bipolar transistor 41a is turned on, the bipolar transistor 57a is turned on and the bipolar transistor 58a is turned off. In this way, a low level signal is input to the control circuit 14 from the bipolar transistor 58a as a switching stop signal.

The control circuit 14 receives the switching stop signal to stop the switching control. In this way, the high-side MOSFET 10 and the low-side MOSFET 11 are turned off, so that stability is ensured.

As described above, according to the switching power-supply device 3, even when the first ground terminal GNDa is open, it is possible to allow the regenerative current of the inductor 102 to flow outside of the control IC 100b from the phase compensation terminal COMP. Therefore, a large negative potential is prevented from being generated in the control IC 100b, so that it is possible to prevent destruction and the like of the control IC 100b.

Furthermore, according to the switching power-supply device 3, it is possible to form a regenerative path by using the phase compensation terminal COMP generally provided in the control IC 100b. Therefore, it is possible to ensure stability when the first ground terminal GNDa is open without increasing the number of terminals of the control IC 100b.

Furthermore, according to the switching power-supply device 3, the regenerative current flows through the fourth path, so that the switching stop signal generation circuit 50a operates and thus the switching control is stopped. Therefore, it is possible to rapidly and reliably stop the switching operation in the abnormal state.

Figure 5:
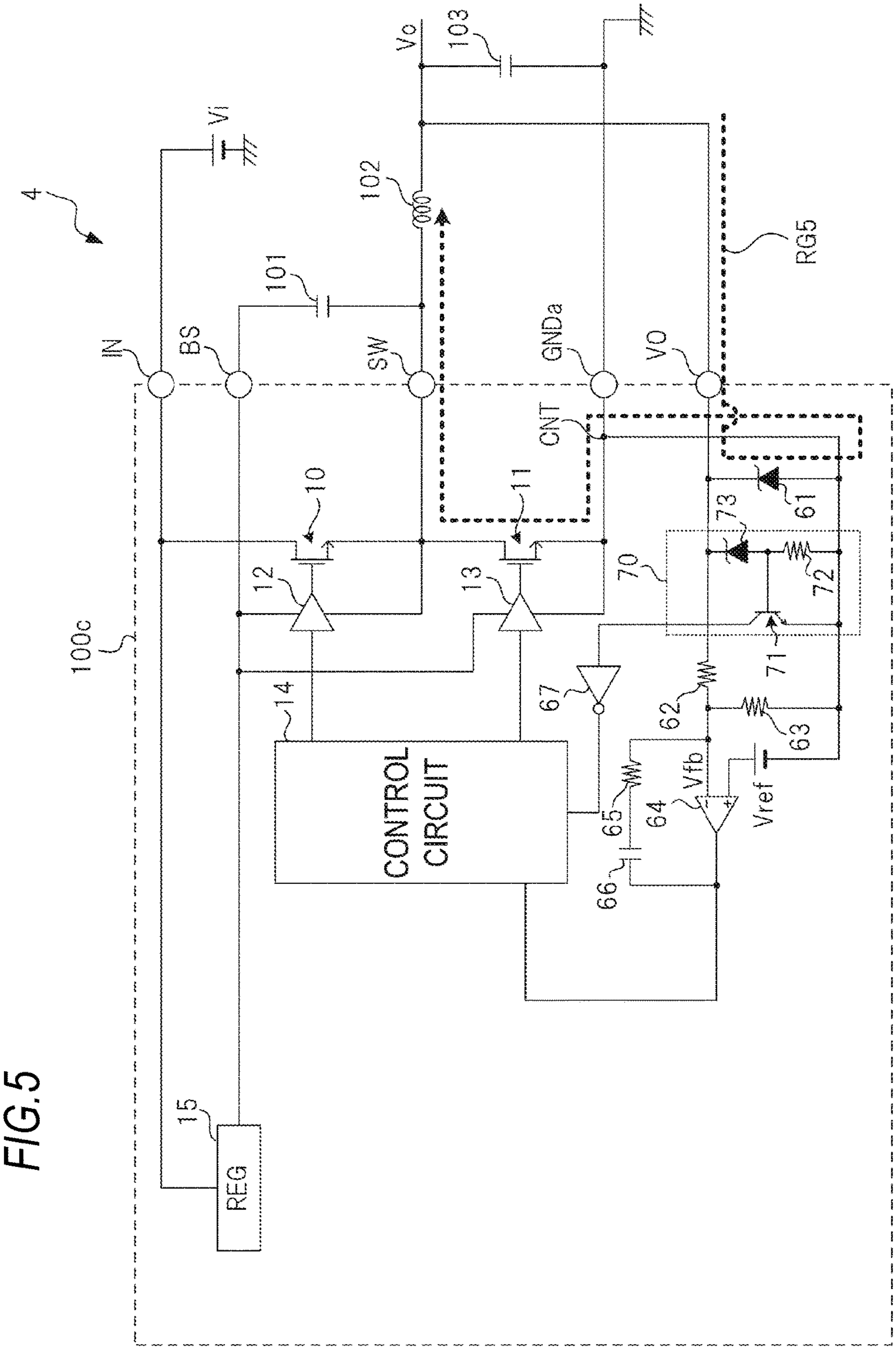
FIG. 5 is a circuit diagram illustrating a schematic configuration of a switching power-supply device 4 which is a modified example of the switching power-supply device 1 illustrated in FIG. 1.

FIG. 5 is a circuit diagram illustrating a schematic configuration of a switching power-supply device 4 which is a modified example of the switching power-supply device 1 illustrated in FIG. 1. In FIG. 5, the same elements as those of FIG. 1 are denoted by the same reference numerals, and a description thereof is omitted.

In the switching power-supply device 4, the control IC 100 in the switching power-supply device 1 illustrated in FIG. 1 is changed to a control IC 100c and the feedback resistors 104 and 105, the phase compensation capacitor 106, and the phase compensation resistor 107 are removed.

In a terminal configuration of the control IC 100c, the feedback terminal FB, the phase compensation terminal COMP, and the second ground terminal GNDb of the control IC 100 are removed and an output voltage input terminal VO is added instead.

The output voltage input terminal VO is connected to a connection point between the inductor 102 and the load circuit, so that an output voltage Vo is input.

The control IC 100c of the switching power-supply device 4 is the same as the control IC 100 of the switching power-supply device 1 in terms of including the high-side MOSFET 10, the low-side MOSFET 11, the high-side drive circuit 12, the low-side drive circuit 13, the control circuit 14, and the regulator 15.

In addition to the aforementioned configuration, the control IC 100c of the switching power-supply device 4 includes a Zener diode 61, a feedback resistor 62, a feedback resistor 63, an error amplifier 64, a phase compensation resistor 65, a phase compensation capacitor 66, a NOT circuit 67, and a switching stop signal generation circuit 70.

A cathode of the Zener diode 61 is connected to the output voltage input terminal VO. An anode of the Zener diode 61 is connected to the connection point CNT.

When the first ground terminal GNDa is open and a voltage of the connection point CNT is equal to or less than a threshold value smaller than a ground level (when a potential difference between the cathode and the anode is equal to or more than a predetermined value), the Zener diode 61 serve as a regenerative path formation element that allows a current to flow and forms a regenerative path through which a regenerative current of the inductor 102 flows from the connection point CNT to the output voltage input terminal VO.

One end of the feedback resistor 62 is connected to the output voltage input terminal VO. The other end of the feedback resistor 62 is connected to one end of the feedback resistor 63. The other end of the feedback resistor 63 is connected to the connection point CNT. To a connection point between the feedback resistor 62 and the feedback resistor 63, a minus-side input terminal of the error amplifier 64 is connected.

A feedback voltage Vfb obtained by dividing an output voltage Vo input to the output voltage input terminal VO by the feedback resistor 62 and the feedback resistor 63 is input to the minus-side input terminal of the error amplifier 64.

A plus-side input terminal of the error amplifier 64 is connected to a power source that supplies the reference voltage Vref. A negative electrode terminal of the power source that supplies the reference voltage Vref is connected to the connection point CNT.

Between the output terminal and the minus-side input terminal of the error amplifier 64, a serial circuit of the phase compensation capacitor 66 and the phase compensation resistor 65 is connected, so that phase compensation is performed. Based on an error amplification signal output from the error amplifier 64, the control circuit 14 controls a control signal such that the output voltage Vo reaches a target value.

The switching stop signal generation circuit 70 includes an NPN type bipolar transistor 71, a resistor 72, and a Zener diode 73.

A cathode of the Zener diode 73 is connected to a connection point between the feedback resistor 62 and the output voltage input terminal VO. An anode of the Zener diode 73 is connected to one end of the resistor 72. The other end of the resistor 72 is connected to the connection point CNT. To a connection point between the Zener diode 73 and the resistor 72, a base terminal of the bipolar transistor 71 is connected.

A collector terminal of the bipolar transistor 71 is connected to an input terminal of the NOT circuit 67. An emitter terminal of the bipolar transistor 71 is connected to the connection point CNT.

The NOT circuit 67 outputs a switching stop signal instructing the stop of switching control by the control circuit 14 when a signal input from the bipolar transistor 71 is in a low level state.

An output signal of the NOT circuit 67 is input to the control circuit 14. The control circuit 14 performs the switching control when the output signal of the NOT circuit 67 is in a low level state and stops the switching control when the output signal of the NOT circuit 67 is in a high level state. The high level output signal output from the NOT circuit 67 constitutes the switching stop signal.

An operation of the switching power-supply device 4 configured as above will be described.

In a normal state in which the first ground terminal GNDa is not open, the potential of the connection point CNT is a ground potential. Consequently, in a period in which the high-side MOSFET 10 is turned off and the low-side MOSFET 11 is turned on, the regenerative current of the inductor 102 is discharged outside of the control IC 100c through a path interconnecting the inductor 102, the switching terminal SW, the low-side MOSFET 11, the first ground terminal GNDa, and the ground, similar to the first path indicated by the broken line RG of FIG. 1.

Furthermore, in the normal state, since the potential of the connection point CNT becomes the ground potential, a potential difference between both ends of the Zener diode 61 becomes small, so that no current flows through the Zener diode 61 and the Zener diode 73.

Consequently, the bipolar transistor 71 is turned off, so that the output of the NOT circuit 67 is at a high level. Consequently, the control circuit 14 continues the switching control.

In an abnormal state in which the first ground terminal GNDa is open, in the period in which the high-side MOSFET 10 is turned off and the low-side MOSFET 11 is turned on, the potential of the connection point CNT is reduced. In this way, the potential difference between both ends of the Zener diode 61 becomes large, so that a current flows through the Zener diode 61.

Consequently, the regenerative current of the inductor 102 is discharged outside of the control IC 100*c* through a fifth path (a path interconnecting the inductor 102, the switching terminal SW, the low-side MOSFET 11, the connection point CNT, the Zener diode 61 (the resistor 72 and the Zener diode 73), and the output voltage input terminal VO) indicated by a broken line RG5 of FIG. 5.

Furthermore, in this period, the regenerative current also flows through the Zener diode 73, so that the bipolar transistor 71 is turned on. When the bipolar transistor 71 is turned on, the potential of the NOT circuit 67 is reduced to the potential of the connection point CNT, so that the switching stop signal is output from the NOT circuit 67.

The control circuit 14 receives the switching stop signal to stop the switching control. In this way, the high-side MOSFET 10 and the low-side MOSFET 11 are turned off, so that stability is ensured.

As described above, according to the switching power-supply device 4, even when the first ground terminal GNDa is open, it is possible to form the regenerative path for discharging the regenerative current of the inductor 102 to the outside of the control IC 100*c*. Therefore, a large negative potential is prevented from being generated in the control IC 100*c*, so that it is possible to prevent destruction and the like of the control IC 100*c*.

Furthermore, according to the switching power-supply device 4, the regenerative current flows through the fifth path, so that the switching stop signal generation circuit 70 operates and thus the switching control is stopped. Therefore, it is possible to rapidly and reliably stop the switching operation in the abnormal state.

It is sufficient if the low-side MOSFET 11 embedded in each of the control IC 100, the control IC 100*a*, the control IC 100*b*, and the control IC 100*c* is an element capable of allowing the regenerative current of the inductor 102 to flow in the period in which the high-side MOSFET 10 is turned off, and the low-side MOSFET 11 is not limited to a transistor. For example, instead of the low-side MOSFET 11, a diode may also be used.

So far, this disclosure has been described with a detailed embodiment; however, the aforementioned embodiment is one example and can be modified and embodied without departing from the scope of this disclosure.

As described above, the following matters are disclosed in the present specification.

(1) A control IC of a switching power-supply device, which converts a first DC voltage supplied from a DC power source into a second DC voltage and outputs, including a switching element, which is connected between the DC power source and an inductor; a control circuit, which performs on-and-off control of the switching element; a regenerative current element, which is serially connected to the switching element and allows a regenerative current of the inductor to flow when the switching element is in a turned-off state; a ground terminal, which is connected to the regenerative current element; and a protection circuit that forms, when a voltage of the connection point is equal to or less than a threshold value, a regenerative path, which connects a connection point between the regenerative current element and the ground terminal to a specific terminal and through which the regenerative current flows and stops the on-and-off control of the switching element by the control circuit.

(2) The control IC of the switching power-supply device according to (1), wherein the protection circuit includes a regenerative path formation element which is connected between the connection point and the specific terminal and allows the current to flow when the voltage of the connection point is equal to or less than the threshold value.

(3) The control IC of the switching power-supply device according to (1), wherein the specific terminal is a ground terminal, that is provided separately from the ground terminal.

(4) The control IC of the switching power-supply device according to (1), wherein the specific terminal is an enable terminal for starting or stopping an operation of the control circuit.

(5) The control IC of the switching power-supply device according to (1), wherein the specific terminal is a phase compensation terminal, to which a phase compensation element is connected, and wherein a diode is connected between the specific terminal and an external ground.

(6) The control IC of the switching power-supply device according to (1), further including a resistive element for resistor-dividing the second DC voltage, wherein the specific terminal is an output voltage input terminal, which is connected to the resistive element and to which the second DC voltage is input.

(7) A switching power-supply device including the control IC of the switching power-supply device according to (1) and the aforementioned inductor.

The invention claimed is:

1. A control IC of a switching power-supply device that converts a first DC voltage supplied from a DC power source into a second DC voltage and outputs, comprising:

a switching element, which is connected between the DC power source and an inductor;

a control circuit, which performs on-and-off control of the switching element;

a regenerative current element, which is serially connected to the switching element and allows a regenerative current of the inductor to flow when the switching element is in a turned-off state;

a ground terminal, which is connected to the regenerative current element; and a protection circuit that forms, when a voltage of a connection point between the regenerative current element and the ground terminal is equal to or less than a threshold value, a regenerative path, which connects the connection point to a specific terminal and through which the regenerative current flows and stops the on-and-off control of the switching element by the control circuit.

2. The control IC of the switching power-supply device according to claim 1, wherein the protection circuit includes a regenerative path formation element which is connected between the connection point and the specific terminal and allows the current to flow when the voltage of the connection point is equal to or less than the threshold value.

3. The control IC of the switching power-supply device according to claim 1, wherein the specific terminal is a ground terminal, that is provided separately from the ground terminal.

4. The control IC of the switching power-supply device according to claim 1, wherein the specific terminal is an enable terminal for starting or stopping an operation of the control circuit.

5. The control IC of the switching power-supply device according to claim 1, wherein the specific terminal is a phase compensation terminal, to which a phase compensation element is connected, and wherein a diode is connected between the specific terminal and an external ground.

6. The control IC of the switching power-supply device according to claim 1, further comprising:

a resistive element for resistor-dividing the second DC voltage, wherein the specific terminal is an output voltage input terminal, which is connected to the resistive element and to which the second DC voltage is input.

7. A switching power-supply device comprising:

the control IC of the switching power-supply device according to claim 1; and the inductor.

* * * * *